INVENTOR.
RICHARD N. MERINGTON
BY *William L. Jones*
ATTORNEY

May 11, 1965 R. N. MERINGTON 3,183,450

AMPLIFIER STABILIZATION

Filed Feb. 19, 1962 2 Sheets-Sheet 2

INVENTOR.
RICHARD N. MERINGTON
BY William L. Jones
ATTORNEY 3,183,450

AMPLIFIER STABILIZATION

Richard N. Merington, Irving, Tex., assignor to Ling-Temco-Vought, Inc., Dallas, Tex., a corporation of Delaware Filed Feb. 19, 1962, Ser. No. 174,157
2 Claims. (Cl. 330—9)

This invention relates generally to the stabilization of amplifiers and, more particularly, to circuits useful in reducing or preventing the drifting tendencies of certain amplifiers, such as D.-C. amplifiers.

While the invention is of general application, it provides particular advantages when applied to stabilize D.-C. amplifiers having feedback arrangements, such as are commonly employed as integrators in computers and other types of equipment. As one example, the invention may be applied to drift-stabilize integrators used to provide phase-shifted signals for comparison with other signals. An integrator of this type to which the invention may be applied is used, for example, in the control system testing apparatus described in the co-pending United States Patent application, Serial No. 118,037, which was filed on June 19, 1961, jointly by Billy C. Hooker and the inventor herein.

One object of the present invention is to provide improved circuitry useful in reducing or preventing the drifting tendency of amplifiers of the type described.

Another object of the invention is to provide improved drift-stabilizing circuitry and to provide improved control system testing apparatus having the improved circuitry included therein.

The foregoing and additional objects are attained by the invention, which involves the concept of drift-stabilizing an amplifier, such as a D.-C. amplifier, by employing signal responsive means adapted when actuated to provide a low-impendance path extending between the input and output circuits of the amplifier.

In one arrangement, the input and output circuits of the amplifier are interconnected by a circuit which includes a normally high-impedance path provided by normally open transistor switching means. The transistor switching means is adapted to close and thereby provide a relatively low-impedance path upon being actuated by an energizing or triggering signal, such as by a pulse or burst of pulses which may correspond in time to a zero or signal reference value occurring in the signals passing through the amplifier.

In a modified arrangement, the normally high-impedance path is provided by a circuit including a normally open diode ring which is adapted to close and thereby provide a relatively low-impedance path upon being actuated by an energizing or triggering signal.

Where the amplifier is of the D.-C. type with a continuously active impedance feedback, such as in an integrator arrangement, the drift-control circuit is in addition to and may extend in parallel with the feedback impedance ordinarily operating between the input and output circuits of the amplifier. By having the drift-control circuit function only at intervals and then only for relatively brief periods of time, the ordinary function of the feedback arrangement due to other components is not objectionably influenced.

The foregoing features and additional objects and advantages of the invention will be more apparent from the following description when read in conjunction with the accompanying drawing in which similar reference characters designate similar parts in all views and wherein.

Figure 1:
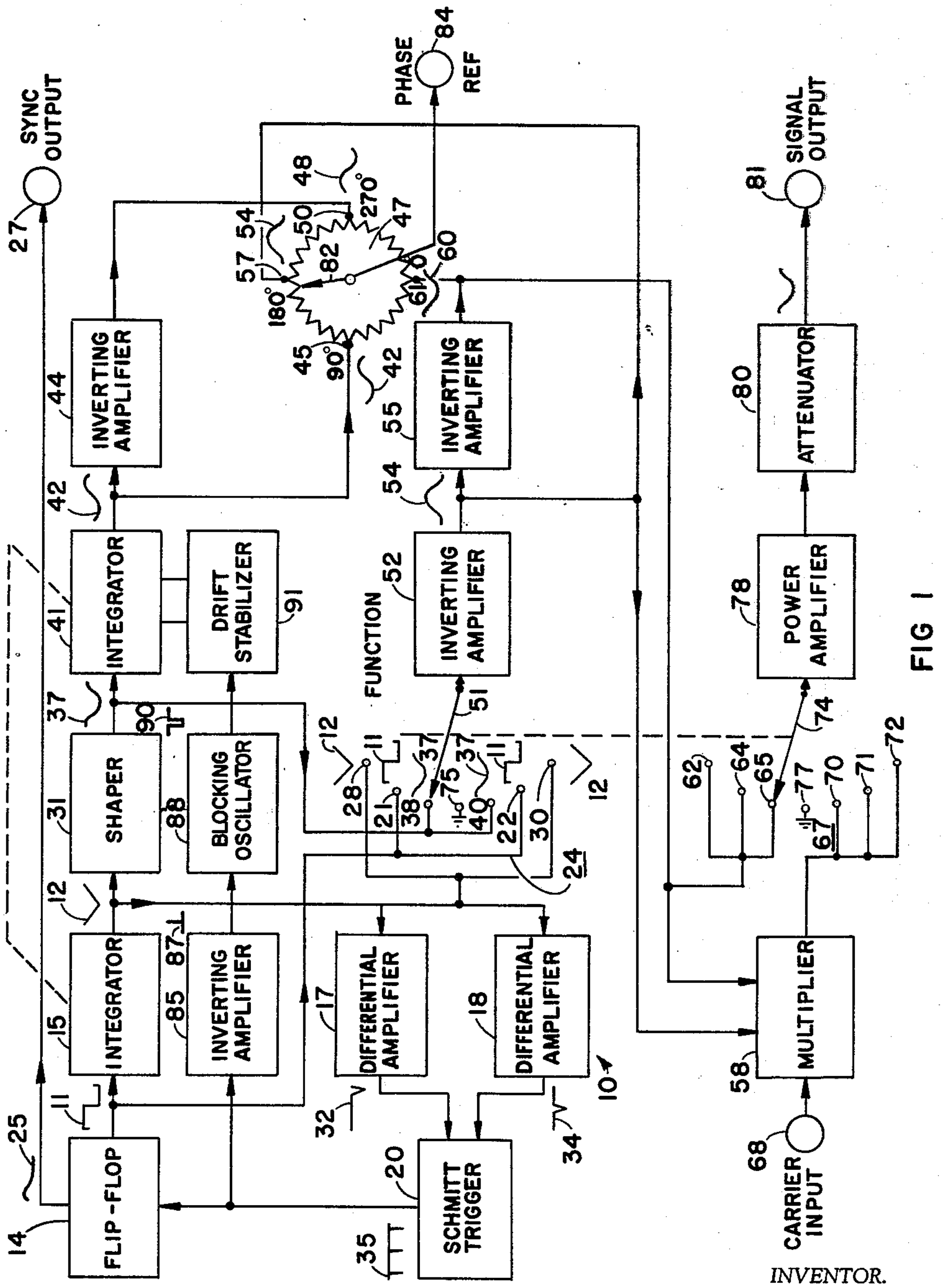
FIGURE 1 is a diagrammatic representation, mainly in block-diagram form, showing one arrangement of control system testing apparatus having the invention incorporated therein.

Referring to the drawing in detail, and first to FIGURE 1, there is shown testing apparatus 10 which, in addition to including components and parts arranged or combined in accordance with the present invention, also includes various circuits in accordance with the teachings of the aforesaid co-pending application, Serial No. 118,037. As will appear more fully hereinafter, the testing apparatus 10 is suited for use in obtaining information relative to a variety of response characteristics and may be employed, for example, in connection with the evaluation or analysis of any of a variety of servo control systems.

As illustrated, the testing apparatus 10 includes a signal generating section which is adapted to make available, at substantially the same time, a variety of types of continuously recurring signals, including step or square wave signals 11 and alternating ramp or triangular wave signals 12.

The signal generating section includes a bistable multivibrator or flip-flop 14 which is part of an oscillator loop. The loop includes also an integrator 15, differential amplifiers 17 and 18, and a Schmitt trigger 20.

The flip-flop 14 is adapted to produce the square wave signals 11, which signals 11 are supplied to terminals 21 and 22 of a function switch 24 and are supplied also to the input circuit of the integrator 15. Additionally, the flip-flop 14 supplies sync signals 25 to a sync output terminal or jack 27, which signals 25 are thus made available to be at times supplied to other equipment, as explained more fully in the aforesaid co-pending application, Serial No. 118,037.

The integrator 15 is adapted to change the square wave signals 11 it receives from the flip-flop 14 into the triangular wave signals 12. These signals 12 are supplied to terminals 28 and 30 of the function switch 24 and are supplied also to the input circuit of each of the differential amplifiers 17 and 18. In addition, the triangular wave signals 12 are supplied to the circuit of a shaper 31, the purpose of which will be described presently.

The differential amplifiers 17 and 18 are controlled by the triangular wave signals 12 supplied thereto by the integrator 15. It will be noted that the signals 12 alternately decrease and increase at approximately linear rates. While shown supplied to both amplifiers 17 and 18 simultaneously, the increasing portions of the signals 12 control only the particular one of these (for example, the amplifier 17) that is sensitive to positive-going signals, while the decreasing portions of the signals 12 control only the other one (for example, the amplifier 18), which is sensitive to negative-going signals.

As described more fully in the aforesaid co-pending application, Serial No. 118,037, the differential amplifiers 17 and 18 produce output signals 32 and 34, respectively, which are supplied to control the Schmitt trigger 20. The operation of the Schmitt trigger 20 is such that a triggering output pulse 35 is produced by it for each control signal 32 and 34 supplied thereto. It will be noted that a triggering pulse 35 is developed when each of the positive-going and negative-going portions of the triangular wave signals 12 reaches a sufficiently high positive or negative value, as the case may be.

The triggering pulses 35 are supplied to control the flip-flop 14 which is thus triggered at a repetition rate or frequency determined in part by the slope or ramp function of the triangular wave signals 12 produced by the integrator 15.

As previously indicated, the triangular wave signals 12 are supplied also to the circuit of the shaper 31. The purpose of the shaper 31 is to change the shape of the triangular wave to an approximate sine wave, thus producing sine wave signals 37 the frequency of which is the same as the repetition rate of the triangular wave signals 12. These sine wave signals 37 are supplied to terminals 38 and 40 of the function switch 24 and are supplied also to the input circuit of a second integrator 41.

The main purpose of the second integrator 41 is to shift the phase of its sine wave input by 90 degrees, thus producing sine wave signals 42 which are 90 degrees out-of-phase, as compared with the sine wave signals 37 supplied to the terminals of the function switch 24.

As previously indicated, it is preferred that the various output signals of the testing apparatus 10 be available at any selected repetition rate in a relatively wide range, including signals both considerably below and considerably above the natural or resonant frequency of the control system being tested. As one example, the signal generating section of the apparatus 10 may produce or supply square, triangular and sine wave signals at any selected repetition rate or frequency within a range extending from about 0.005 to about 1,000 cycles per second.

To these ends, it is preferred that the slope or ramp function of the first integrator 15 be adjustable or variable over a sufficiently wide range to permit a relatively wide variation in the repetition rate or frequency of the triggering pulses supplied to control the flip-flop 14. This may be accomplished by adjusting or varying certain of the circuit values affecting the time constant in the integrator 15, as described more fully in the aforesaid co-pending application, Serial No. 118,037.

It will be understood that an adjustment or variation affecting the circuit values in the integrator 15, which results in changing the repitition rate or frequency of the flip-flop 14 results also in changing the repetition rate or frequency of the subsequent triangular wave signals 12 and, thus, of the sine wave signals 37 which are developed in the shapes 31.

Since it is preferred that the pin wave signal 37 supplied the input circuit of the second integrator 41 always be shifted in phase by 90 degrees, regardless of the particular frequency at which the signal generating section is then operating, it is preferred that the time constants affecting the circuit values of such integrator 41 also be adjustable or variable, such as by switching and adjustment means ganged or otherwise connected so as to be movable with the switching and adjustment means used to change the time constants of the first integrator 15. Such an arrangement is indicated in the drawing by the dashed lines interconnecting the integrators 15 and 41.

As one example, the second integrator 41 may include a high-gain, direct-coupled amplifier with an adjutsable series summing resistance and with an adjustable feedback capacitance, as described more fully with reference to the first integrator 15 in the aforesaid co-pending application, Serial No. 118,037.

The sine wave output signals 42 of the second integrator 41 are supplied to the input circuit of an inverting amplifier 44 and are supplied also to a 90-degree terminal 45 of a rotary potentiometer 47. The inverting amplifier 44 is adapted to shift the phase of the signals 42 by 180 degrees, thus producing sine wave signals 48 that are 270 degrees out-of-phase, as compared with the sine wave signals 37 appearing at the function swich 24. The sine wave signals 48 are supplied to a 270-degree terminal 50 of the rotary potentiometer 47.

The function switch 24 has a movable arm 51 which permits an operator to select the square wave signals 11 from terminals 21 or 22, the triangular wave signals 12 from terminals 28 or 30, or the sine wave signals 37 from terminals 38 or 40.

The switch arm 51 supplies the selected signals to the input circuit of an inverting amplifier 52 that is adapted to shift the phase of the signals by 180 degrees. For example, assuming the switch arm 51 is positioned in contact with terminal 38, as shown in the drawing, the sine wave signals 37 thus supplied to the input of the amplifier 52 are shifted in phase by 180 degrees to produce sine wave output signals 54. These signals 54 are supplied to the input circuit of another inverting amplifier 55 and are supplied to a 180-degree terminal 57 of the rotary potentiometer 47. Additionally, the signals 54 are supplied to a multiplier 58, the purpose of which will be described presently.

The inverting amplifier 55 is adapted to shift the phase of the signals 54 my another 180 degrees to produce sine wave output signals 60 that are 360 degrees out-of-phase, as compared with the sine wave signals 37 appearing at the funciton switch 24. However, due to the very rapid transit time of the electrical energy, as compared with the duration of a cycle of one of the signals, the signals 60 are for all practical purposes in-phase with the signals 37. Thus, the singals 60 may be supplied, as shown, to a 0-degree terminal 61 of the rotary potentiometer 47.

The output signals 60 of the amplifier 55 are supplied also to the multiplier 58 and to terminals 62, 64 and 65 of a function switch 67.

When the control system being tested is of the carrier-wave type, a carrier-wave input signal (not shown) is supplied to input terminal or jack 68 which is electrically connected to the multiplier 58. The carrier-wave input may be obtained from the control system being tested and may be a continuous wave within the frequency range extending, for example, from about 50 to about 10,000 cycles per second. As described more fully in the aforesaid co-pending application, Serial No. 118,037, the main purpose of the multiplier 58 is to generate or produce a modulated carrier-wave output signal which is supplied to terminals 70, 71 and 72 of the function switch 67.

The function switch 67 has a movable arm 74 which permits an operator either to select the sine wave output signals 60 (or one of the other output signals of the amplifier 55) appearing on terminals 62, 64 or 65 to select one of the modulated carrier-wave output signals of the multiplier 58 appearing on terminals 70, 71 or 72. It is preferred that the movable arm 74 of the function switch 67 be ganged or otherwise connected so as to be movable with the movable arm 51 of the function switch 24, as indicated by the dashed lines in the drawing interconnecting the arms 51 and 74.

It will be noted that the arm 74 selects the output signals from the multiplier 58 only when the arm 51 is selecting one of the signals appearing on terminals 22, 30 or 40 of the function switch 24. Likewise, the movable arm 74 of the switch 67 selects the direct output signal from the inverting amplifier 55, rather than the modulated carrier-wave output signal from the multiplier 58, whenever the movable arm 51 of the switch 24 is selecting one of the signals appearing at terminals 21, 28 or 38 thereof.

The switches 24 and 67 are shown provided with terminals 75 and 77, respectively, which are connected to ground and thus do not have signals appearing thereat. These terminals 75 and 77 are mainly for the purpose of permitting an operator to avoid selecting any of the aforesaid signals, such as might be desired during the source of calibrating or repairing the equipment.

The arm 74 of the function switch 67 supplies the signals, selected as aforesaid, to the input of a power amplifier 78 which in turn supplies the signals (without overall phase change) through an attenuator 80 to a signal output terminal or jack 81. The attenuator 80 is adjustable and is preferably provided with calibrated control knobs or other suitable means for indicating the amount by which the output signals are attenuated. For example, the attenuator 80 may include several "T-pad" variable resistances with knobs calibrated in small increments, such as in 0.1 decibel units, to permit relatively accurate information to be obtained by direct readings concerning the relative attenuation occurring at each setting of the control knobs.

While the output signals 54 and 60 appearing, respectively, at the 180-degree terminal 57 and at the 0-degree terminal 61 of the potentiometer 47 are shown as sine waves, it is understood that whether these signals 54 and 60 are square, triangular or sine wave depends upon the position of the switch arm 51. Likewise, the type of signals appearing at the signal output jack 81 depends upon the positioning of the ganged switch arms 51 and 74. On the other hand, the sine wave output signals 42 and 48 appearing, respectively, at the 90-degree terminal 45 and at the 270-degree terminal 50 of the potentiometer 47 do not change to square or triangular wave signals when the ganged switch arms 51 and 74 are moved.

The potentiometer 47 has a wiper arm 82 that is movable along the circular resistance element to which the terminals 45, 50, 57 and 61 are connected. The arm 82 is adapted to supply signals to a phase reference output terminal or jack 84 to which other equipment is at times connected, as will appear more fully hereinafter.

It is preferred that the potentiometer 47 be of the linear type and be relatively highly accurate, so that a relatively linear and uniform amount of both mechanical and electrical variation occurs for each angular movement or displacement of the wiper arm 82. Also, it is preferred that angularly adjacent ones of the terminals 45, 50, 57 and 61 be relatively accurately spaced apart by 90 degrees.

With suitable calibration of the control knob or dial of the potentiometer 47, it thus is possible to read directly and relatively accurately the phase variations which correspond to the various positions of the wiper arm 82 as it is rotated or moved from 0 to 360 degrees.

Up to this point, the description of the testing apparatus 10 has involved circuits and components arranged or combined in accordance with the teachings of the aforesaid co-pending application, Serial No. 118,037. The present invention is particularly concerned with improvements which involve different or additional circuits and components now to be described.

It will be noted that the Schmitt trigger 20, previously described, has its output triggering pulses 35 shown supplied also to an inverting amplifier 85. The amplifier 85 is adapted to shift the polarity of the pulses, thereby producing positive-going pulses 87. These pulses 87 are supplied to the input circuit of a free-running blocking oscillator 88 which in turn produces a negative-going signal burst 90 for each pulse 87 supplied thereto. The overall or total duration of each of the signal bursts 90 may be several times as long as the duration of one of the pulses 87; however, the repetition rate of the bursts 90 and pulses 87 are ordinarily equal, there being one of each for each triggering pulse 35 supplied by the Schmitt trigger 20.

The signal bursts 90 are supplied to a drift stabilizer 91 which, in accordance with the invention, is adapted to intervally provide a low-impedance path extending between the input and output circuits of the second integrator 41. As will appear more fully hereinafter, the low-impedance path is provided preferably at least several times in response to each of the signal bursts 90, such as once for each component pulse of the energy making-up or included in a given one of the signal bursts 90.

Figure 2:
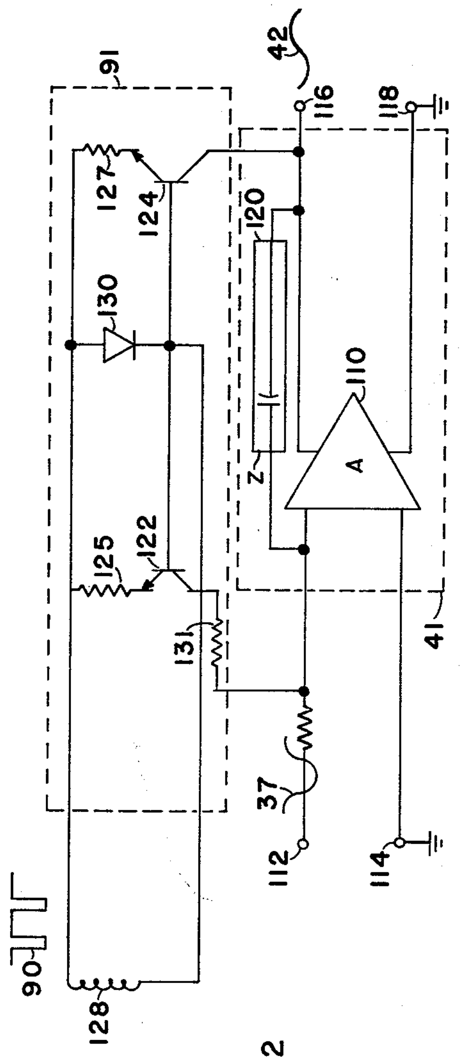
FIGURE 2 is a schematic representation, partly in block-diagram form, showing in greater detail one form of drift-control circuit arrangement in accordance with the invention.

As shown best in FIGURE 2, the second integrator 41 preferably includes a D.-C. amplifier 110 provided with signal input terminals 112 and 114 and with signal output terminals 116 and 118. A feedback impedance 120, which may be several capacitors arranged with switching means to permit selection of the value of feedback capacitance to be included, is shown connected between the output terminal 116 and the input terminal 112. A series summing resistance, such as the adjustable series summing resistance described more fully in the aforesaid copending application, Serial No. 118,037, will ordinarily be connected between the input terminal 112 and source of sine wave signals 37 supplied to the integrator 41.

Where the integrator 41 is included as part of the testing apparatus 10 of FIGURE 1, it is understood that the input terminals 112 and 114 will ordinarily be connected to the output circuit of the shaper 31. The output terminals 116 and 118 will ordinarily be connected to the input circuit of the inverting amplifier 44. Also, the terminal 116 will ordinarily be connected to the 90-degree terminal 45 of the rotary potentiometer 47, the other output terminal 118 being connected to signal ground or to a point of common or reference voltage value.

Accordingly, it will be noted in FIGURE 2 that the sine wave signal 37 is shown as appearing across the input terminals 112 and 114 of the D.-C. amplifier 110, while the phase-shifted sine wave signal 42 is shown appearing across the output terminals 116 and 118 of such amplifier 110.

In a preferred arrangement, the drift stabilizer 91 is shown in FIGURE 2 as including transistor switching means connected so as to be normally open and adapted to be actuated so as to close intervally in response to and during each of the signal bursts 90 supplied, as aforesaid, by the blocking oscillator 88.

As illustrated, the transistor switching means includes transistors 122 and 124 having their respective emitter electrodes connected through resistors 125 and 127, respectively, to one end of a transformer winding 128 and also to the anode side of a diode 130. The transformer winding 128 is, for example, the output winding of the blocking oscillator 88 of FIGURE 1.

The transistors 122 and 124 have their base electrodes connected to each other and also to the other end of the transformer output winding 128 and to the cathode side of the diode 130. The collector electrode of the transistor 122 is shown connected through a resistor 131 to the input terminal 112 of the D.-C. amplifier 110, while the other transistor 124 has its collector electrode shown connected directly to the output terminal 116 or the amplifier 110.

In operation, the transistors 122 and 124 provide a low-impedance path in parallel with the feedback impedance 120 only when a pulse component of a signal burst 90 is providing a negative voltage supplied through the resistors 125 and 127, respectively, to the emitter electrodes of the transistors 122 and 124, respectively. That is, the transistors 122 and 124 conduct current when the voltages on their interconnected base electrodes are positive (with respect to their emitter electrodes). This occurs when the emitter electrodes are driven negative during a signal burst 90 and results in greatly reducing or lowering the normally high-impedance path existing with each transistor 122 and 124 between its base and collector electrodes.

On the other hand, if the voltages on the emitter electrodes of the transistors 122 and 124 become positive, the diode 130 is available to conduct current so as to provide a return flow path across the winding 128. In this instance, the transistor switching means is not actuated and thus remains in its normally open condition, providing a very high-impedance path in parallel with the feedback impedance 120 extending between the terminals 112 and 116 of the amplifier 110.

It will be noted that when the transistor switching means is closed, with current flowing through each of the transistors 122 and 124, any voltage difference then existing between the input terminal 112 and the output terminal 116 is permitted to substantially disappear, due to the low-impedance path provided in either direction through the transistor switch.

The resistor 131, which is connected in series with the aforesaid low-impedance path, functions mainly to provide a damping resistance for current which flows when the normally open transistor switch is closed upon being actuated by energy in one of the signal bursts 90.

The operation of the invention will now be described with particular reference to its application in control system testing operations involving use of the testing apparatus 10 of FIGURE 1.

In order to analyze or evaluate the performance of a servo control system, it is ordinarily desirable to obtain information concerning phase changes which occur. Also, information is desired concerning changes in gain or amplification characteristics of the servo control system which occur with different input signals and signal frequencies. Additionally, information is desired concerning the response characteristics of the servo control system where more or less abruptly changing input signals are employed, thereby indicating its performance or behavior under transient conditions.

As described more fully in the aforesaid co-pending application, Serial No. 118,037, the desired information is obtainable using the testing apparatus 10 and related equipment, by making certain measurements and comparisons indicative of the changes which occur in the servo control system.

In connection with the performance of such testing operations, the second integrator 41 functions to shift the phase of its sine wave input signals 37 by 90 degrees, as previously indicated. The signals 37 are of the constant-amplitude type, so that it would be expected that there would be no amplitude variation between successive cycles of the output sine wave signals 42 with respect to zero or a base reference point or value, assuming that there is no drifting tendency. However, in the absence of suitable amplifier stabilization, experience has shown that some drifting will occur and this will be noticeable in the amplifier output circuit, where the zero or base reference point of the sine wave signals 42 will shift in value. As a result, there will be a tendency for the signals 42 to have certain cycles which are not of uniform positive and negative variation. For example, a given cycle may during its positive half-cycle reach a maximum value which exceeds by a fraction of a volt, or even more, the maximum negative value which it reaches during the succeeding or preceding negative half-cycle.

Where the present invention is employed, if the zero or base reference point of the sine wave output signals 42 shifts upwardly or downwardly, such as due to drifting, the resulting potential difference which will exist between the input terminal 112 and the output terminal 116 will result in current flow in a direction such as to equalize the voltage during the next brief period when the transistor switch is closed, which occurs momentarily at least once for each triggering pulse 35 developed in the Schmitt trigger 20.

Since the triggering pulses 35 coincide in time with the high positive and high negative portions of the triangular wave signals 12, which in turn are changed in shape by the shaper 31 to produce the sine wave signals 37 supplied to the input of the second integrator 41, it is apparent that a controlled repetition rate relationship will exist between each of these various wave forms and the occasion of the transistor switching means being actuated by the signal bursts 90 supplied to the drift stabilizer 91. However, as previously indicated, each of the signal bursts 90 may extend in duration several times or more as long as one of the triggering pulses 35, so that the occasions of the transistor switching means being actuated do not necessarily coincide exactly with the occurrences of the pulses 35 themselves. On the other hand, since the repetition rate of the signal bursts 90 is the same as that of the triggering pulses 35 and, it will be noted, is twice the frequency of the sine wave signals 37 or 42, there will be at least two occasions during each cycle of the signals 37 and 42 when the input and output circuits of the D.C. amplifier 110 are in effect shorted together for a very brief instant. Ordinarily, of course, the signals bursts 90 will each include a number of pulses for each of which there will be one very brief shorting together of these circuits, with the result that any residual D.C. voltage causing a potential difference between the terminals 112 and 116 will be effectively cancelled at least several times during an interval that is short compared with the period of a cycle during each half-cycle of the signals 37 and 42.

As described more fully in the aforesaid co-pending application, Serial No. 118,037, the signals passing through the integrator 41 may be changed or varied in frequency, such as by adjusting the frequency range or vernier frequency setting of the testing apparatus 10. However, since the repetition rate of the triggering pulses 35 produced by the Schmitt trigger 20 is also changed or adjusted, the operation of the drift stabilizer 91 is in effect correlated with the other circuits to provide drift stabilization at intervals which are automatically adjusted in repetition rate in accordance with the frequency of the particular sine wave signals passing through the integrator 41.

Figure 3:
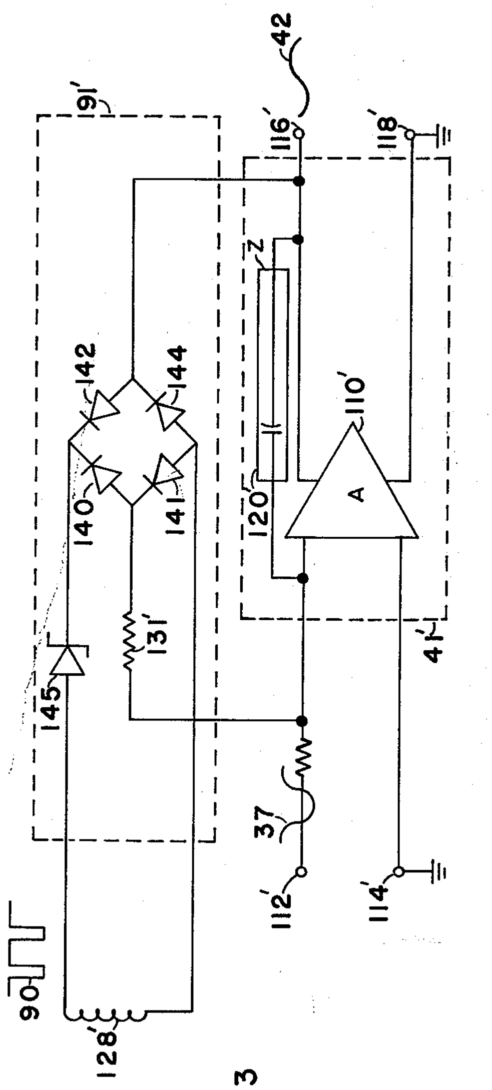
FIGURE 3 is a view similar to that of FIGURE 2, showing another form of drift-control circuit arrangement in accordance with a modification of the invention.

Referring now to FIGURE 3, the arrangement there illustrated includes a modification of the invention that may be used to advantage in certain applications.

It will be noted in FIGURE 3 that certain components are designated by numbers which are primed but otherwise are the same as those used to designate corresponding parts of the arrangement previously described with reference to FIGURES 1 and 2.

Thus, in FIGURE 3 there is shown an integrator 41' which includes a D.-C. amplifier 110' having input terminals 112' and 114' and having output terminals 116' and 118', with a feedback impedance 120' being shown connected between the terminals 112' and 116'. Also, there is shown a transformer winding 128' which, it is understood, may be the output winding of the blocking oscillator 88 of FIGURE 1.

The modified arrangement of FIGURE 3 includes a drift stabilizer 91' which, instead of including transistor switching means for intervally providing a low-impedance path, includes a diode ring connected so as to perform a similar function in response to signal bursts 90 supplied thereto, such as by the blocking oscillator 88 of FIGURE 1.

As illustrated, the diode ring includes diodes 140 and 141 forming one pair of adjacent arms of a bridge which includes also diodes 142 and 144 forming another pair of adjacent arms. Each of these pairs has its diodes connected in the same sense with each other and the two pairs are connected in parallel so that the adjacent upper diodes of the bridge are connected in opposite sense to each other, as also are the adjacent lower diodes of the bridge.

The diodes of one pair, such as the diodes 140 and 141, have their interconnected anode and cathode sides shown connected through a resistor 131 to the input terminal 112' of the D.-C. amplifier 110'. The diodes of the other pair, such as the diodes 142 and 144, have their interconnected anode and cathode sides connected electrically to the output terminal 116' of the D.-C. amplifier 110', such as by direct electrical connection.

A Zener diode 145 is connected between one end of the transformer output winding 128' and one end of the bridge where adjacent diodes, such as the diodes 140 and 142, of opposite sense are interconnected. Thus, the cathode sides of the diodes 140 and 142 are shown connected to the cathode side of the Zener diode 145.

The other end of the transformer output winding 128' is connected directly to the other end of the bridge where adjacent diodes, such as the diodes 141 and 144, of opposite sense are interconnected. Thus, the anode sides of the diodes 141 and 144 are shown connected to this end of the winding 128'.

The arrangement is such that the parallel pairs of diodes forming the diode ring are connected in series with the Zener diode 145 across the transformer winding 128' in the proper sense so that each of the diodes 140, 141, 142, 144 and 145 is adapted to conduct current when a voltage difference of the proper sense appears across the winding 128', such as when a negative pulse of the signal burst 90 is supplied to the stabilizer 91' by the blocking oscillator 88 of FIGURE 1.

In operation, the diode ring provides a low-impedance path across the D.-C. amplifier 110' in parallel with the feedback impedance 120' only when a pulse component of a signal burst 90 is providing a voltage greater than the Zener breakdown value of the Zener diode 145. That is, each of the diodes 140, 141, 142 and 144 conducts current when the voltages on their cathode sides are negative (with respect to their anode sides). This occurs when the anode side of the Zener diode 145 is driven sufficiently negative during a signal burst 90 and results in greatly reducing or lowering the normally high-impedance path existing within each diode between its anode and cathode.

On the other hand, when there is no voltage difference in the proper direction or sense across the diodes, the diode ring remains in its normally open condition, providing a very high-impedance path in parallel with the feedback impedance 120' extending between the terminals 112' and 116' of the amplifier 110'.

It will be noted that when the diode ring is closed, with current flowing through each of the diodes 140, 141, 142 and 144, any voltage difference then existing between the input terminal 112' and the output terminal 116' of the D.-C. amplifier 110' is permitted to substantially disappear, due to the low-impedance path provided in either direction through the diode ring.

It is preferred that the Zener diode 145 have a Zener breakdown value which is sufficiently low to permit some current to flow through the diode ring during each signal burst 90 and which is nonetheless sufficiently high to prevent current flow through the diode ring due to any ordinary voltage difference existing between the input terminal 112' and the output terminal 116' of the amplifier 110'. For example, if the output signal 42 is expected to "swing" a maximum of 10 volts above and 10 volts below a zero or reference voltage value, the Zener diode 145 may be selected to have a breakdown value greater than 10 volts and yet less than the peak voltage expected to exist across the winding 128' during one of the signal bursts 90.

The resistor 131', which is connected in series with the aforesaid low-impedance path, functions mainly to provide a damping resistance for current which flows when the normally open diode ring is closed upon being actuated by energy in one of the signal bursts 90.

While it is anticipated that the arrangement of FIGURE 3 may be widely applied, it is recommended for best results that the diodes used, particularly in the diode ring, be selected to have as nearly as possible similar characteristics, particularly with regard to the voltage bias required to cause current flow to commence.

It is understood that the invention is not to be considered as limited to the particular arrangement herein described, by way of example, the scope of the invention being best defined with reference to the appended claims.

I claim:

1. In an integrator circuit that has a high-gain direct-current amplifier and an integrating capacitor, said capacitor being connected between the input and the output of said amplifier, signal generating means for applying a sinusoidal signal to said input of said amplifier,
   - a drift stabilizer circuit for maintaining substantially constant reference voltage of the sinusoidal output of said amplifier, said drift stabilizer including an electronic switch, said electronic switch having a control input and an output switching circuit, said output switching circuit being connected in parallel with said capacitor, said electronic switch operating in response to application of a signal impulse to its input to short-circuit said capacitor, and thereby to equalize the voltage between said output and said input of said amplifier,
   - means coupled to said signal generating means to apply bursts of signal synchronized with said sinusoidal signal to said control input of said electronic switch, each of said bursts occurring precisely at each of the peaks of the sinusoidal signal that is applied to the input of said amplifier for an interval that is short compared with the period of the simultaneous wave of said sinusoidal signal, whereby said equalization of voltages occurs at an instant when said output voltage of said amplifier normally equals said reference voltage.

2. In an integrator circuit according to claim 1 in which said electronic switch comprises a break-down diode and a normally nonconductive diode ring switch, said diode ring switch having an output switching circuit connected in parallel with said capacitor and a control input circuit connected through said break-down diode to said means for applying said synchronized bursts of signal, said diode becoming conductive in response to application of said bursts that have amplitudes greater than the breakdown voltage of said diode to apply simultaneously current pulses to said control input circuit of said diode ring switch, and said diode ring switch becoming conductive in response to application of current pulses to its input to equalize the voltage between said input and said output of said amplifier.

References Cited by the Examiner

UNITED STATES PATENTS

| | | | |
|---|---|---|---|
| 2,253,976 | 8/41 | Guanella | 330—9 |
| 2,994,825 | 8/61 | Anderson | 330—9 X |
| 3,070,786 | 12/62 | MacIntyre | 330—9 X |
| 3,130,325 | 4/64 | Rubin et al. | 330—9 X |

OTHER REFERENCES

Bright, R. L., and Kruper, A. P.: "Transistor Choppers for Stable D.C. Amplifiers," Electronics, April 1955, pages 135–137.

ROY LAKE, *Primary Examiner.*

JOHN KOMINSKI, *Examiner.*